(12) United States Patent
Janak et al.

(10) Patent No.: US 10,299,403 B2
(45) Date of Patent: May 21, 2019

(54) MODULAR THERMAL SOLUTION FOR HIGH-PERFORMANCE PROCESSORS

(71) Applicants: Chris Janak, Austin, TX (US);
Christopher Jaggers, Austin, TX (US);
Ali Akbar Merrikh, Austin, TX (US)

(72) Inventors: Chris Janak, Austin, TX (US);
Christopher Jaggers, Austin, TX (US);
Ali Akbar Merrikh, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 62 days.

(21) Appl. No.: 14/863,073

(22) Filed: Sep. 23, 2015

(65) Prior Publication Data
US 2017/0083058 A1 Mar. 23, 2017

(51) Int. Cl.
*H05K 7/20* (2006.01)
*G06F 1/20* (2006.01)

(52) U.S. Cl.
CPC .......... *H05K 7/20145* (2013.01); *G06F 1/20* (2013.01); *G02F 2201/36* (2013.01); *H05K 7/20163* (2013.01); *H05K 7/20172* (2013.01)

(58) Field of Classification Search
CPC .... F28F 9/22; H05K 5/02; H05K 7/20; H05K 5/0213; H05K 7/20145; H05K 7/20136–7/20172; G06F 1/20–1/203; B23P 15/26; G02F 2201/36; H01L 23/467
USPC ........................ 361/679.49–679.51, 695–697; 165/80.1–80.3, 185, 121; 257/721–722
See application file for complete search history.

(56) References Cited

U.S. PATENT DOCUMENTS

| | | | |
|---|---|---|---|
| 5,019,880 A | 5/1991 | Higgins, III | |
| 5,358,032 A | 10/1994 | Arai et al. | |
| 6,018,459 A | 1/2000 | Carlson et al. | |
| 6,084,770 A | 7/2000 | Wyland | |
| 6,181,556 B1 * | 1/2001 | Allman | G06F 1/20 165/185 |
| 6,459,577 B1 * | 10/2002 | Holmes | G06F 1/20 165/80.3 |
| 6,695,041 B2 * | 2/2004 | Lai | G06F 1/203 165/104.21 |
| 6,732,786 B1 * | 5/2004 | Lee | H01L 23/427 165/104.33 |
| 6,747,865 B2 | 6/2004 | Capriz et al. | |
| 6,778,390 B2 * | 8/2004 | Michael | H01L 23/467 165/121 |

(Continued)

OTHER PUBLICATIONS

CPU coolers compared, p. 9—Pentium 4 coolers; www.dansdata.com/coolercomp_p9.htm; Apr. 1, 2008; pp. 1-32.

(Continued)

*Primary Examiner* — Zachary Pape
(74) *Attorney, Agent, or Firm* — Timothy M. Honeycutt

(57) ABSTRACT

Various modular thermal management systems for a computing device and methods of using the same are disclosed. In one aspect, a method of providing thermal management for a heat generating component is provided. The method includes placing a heat sink in thermal contact with the heat generating component and coupling a shroud to the heat sink. The shroud has a first opening to direct air in a first direction past the heat sink and a second opening to direct air in a second direction past the heat sink. Air is moved through the first opening or the second opening.

19 Claims, 5 Drawing Sheets

(56) References Cited

U.S. PATENT DOCUMENTS

| | | | | |
|---|---|---|---|---|
| 6,924,978 | B2* | 8/2005 | DiStefano | G06F 1/203 |
| | | | | 165/104.33 |
| 7,178,587 | B2* | 2/2007 | Liu | H01L 23/467 |
| | | | | 165/121 |
| 7,325,590 | B2* | 2/2008 | Kim | G06F 1/203 |
| | | | | 165/104.21 |
| 7,463,484 | B2 | 12/2008 | Wang et al. | |
| 7,911,791 | B2 | 3/2011 | Refai-Ahmed et al. | |
| 7,929,302 | B2* | 4/2011 | Chuang | G06F 1/20 |
| | | | | 165/121 |
| 8,120,912 | B2* | 2/2012 | Aybay | H05K 7/20563 |
| | | | | 361/694 |
| 8,295,040 | B2* | 10/2012 | Knopf | G06F 1/181 |
| | | | | 361/679.47 |
| 8,305,752 | B2* | 11/2012 | Ke | G06F 1/20 |
| | | | | 165/80.2 |
| 8,622,790 | B2* | 1/2014 | Chou | F24F 13/00 |
| | | | | 454/184 |
| 8,941,987 | B2* | 1/2015 | Makley | G06F 1/20 |
| | | | | 165/104.11 |
| 9,069,535 | B2* | 6/2015 | Degner | G06F 3/00 |
| 2005/0237718 | A1 | 10/2005 | Lee et al. | |
| 2006/0162340 | A1* | 7/2006 | Kuo | G06F 1/20 |
| | | | | 62/3.2 |
| 2007/0091566 | A1* | 4/2007 | Sun | G06F 1/20 |
| | | | | 361/695 |
| 2007/0151712 | A1 | 7/2007 | Foster et al. | |
| 2010/0053868 | A1* | 3/2010 | Yang | G06F 1/20 |
| | | | | 361/679.5 |
| 2011/0247787 | A1* | 10/2011 | Liu | G06F 1/20 |
| | | | | 165/104.28 |
| 2012/0067553 | A1* | 3/2012 | Sun | G06F 1/20 |
| | | | | 165/104.34 |
| 2012/0327589 | A1* | 12/2012 | Sun | G06F 1/181 |
| | | | | 361/679.47 |
| 2013/0298396 | A1* | 11/2013 | Bi | H01L 33/64 |
| | | | | 29/829 |
| 2014/0334093 | A1* | 11/2014 | Wei | G06F 1/20 |
| | | | | 361/679.47 |
| 2016/0088774 | A1* | 3/2016 | Alvarado | H05K 7/20736 |
| | | | | 361/679.46 |

OTHER PUBLICATIONS

Spire Coolers; CPU Coolers; http://www.spirecoolers.com/main/product_cpu.asp?p=15; May 7, 2009; pp. 1-2.

Arrow Electronics, Inc.; BFB0712H DC Blower; https://components.arrow.com; Jul. 13, 2015; pp. 1-2.

* cited by examiner

MODULAR THERMAL SOLUTION FOR HIGH-PERFORMANCE PROCESSORS

BACKGROUND OF THE INVENTION

1. Field of the Invention

This invention relates generally to semiconductor processing, and more particularly to thermal management systems for computing devices and methods of using the same.

2. Description of the Related Art

Heat buildup within computing devices, such as computers and game consoles, is potentially troublesome not only for the high-power dissipation devices, such as the various processors and memory devices within such devices, but also for all of the other components housed within the device enclosure, including data storage devices, chipsets and even the various passive components on a typical system board. To transfer heat from various internal components, many conventional computing devices incorporate a heat sink in thermal contact with the higher heat dissipating devices along with a cooling fan.

Conventional heat sinks and cooling fans come in a large variety of configurations. Most include multiple thin plates joined or otherwise fastened to a base and spaced closely together. The base is designed to seat on a thermal spreader or lid associated with a given semiconductor device and provide a thermal resistance pathway. In some conventional designs, air is directed past the plates in a direction parallel to the long axes thereof and either allowed to directly exit the plates or first impinge the base and then exit laterally. These parallel flow conventional designs use so-called direct flow. In another variant, air is pulled upward as opposed to being directed downward.

Many current vendors offer different models of heat sinks. Some examples include the Model TR2-R1 CPU Cooler from Thermaltake, the Model CNPS 7500 from Zalman, and the Model SP420B8 CopperStream from Spire.

Current thermal solutions are designed based on a specific type of chassis conditions such as the available airflow, ambient temperature, and mechanical placement requirements, i.e., keep-outs inside the device case or enclosure. Thus, a given thermal solution has to be designed based on given constraints dictated by the system design. Fans provide airflow that is unique depending on the way a fan is mounted. For example, airflow for a fan positioned on top of a finned heat sink will be different than for one that is side-mounted relative to the heat sink. Furthermore, since conventional heat sinks are tailored to particular system designs, upgrades or other changes to the internals of a device case may require insertion of a completely different style of heat sink and fan arrangement.

The present invention is directed to overcoming or reducing the effects of one or more of the foregoing disadvantages.

SUMMARY OF EMBODIMENTS OF THE INVENTION

In accordance with one aspect of an embodiment of the present invention, a thermal management system is provided that includes a heat sink operable to convey heat from a heat generating component and a shroud that has a first opening to direct air in a first direction past the heat sink and a second opening to direct air in a second direction past the heat sink.

In accordance with another aspect of an embodiment of the present invention, a computing device is provided that includes an enclosure, a heat generating component in the enclosure and a heat sink in the enclosure that is operable to convey heat from a heat generating component. A shroud is in the enclosure and has a first opening to direct air in a first direction past the heat sink and a second opening to direct air in a second direction past the heat sink.

In accordance with another aspect of an embodiment of the present invention, a method of providing thermal management for a heat generating component is provided. The method includes placing a heat sink in thermal contact with the heat generating component and coupling a shroud to the heat sink. The shroud has a first opening to direct air in a first direction past the heat sink and a second opening to direct air in a second direction past the heat sink. Air is moved through the first opening or the second opening.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

A modular thermal management system for a computing device may include a heat sink, a shroud to selectively route air past the heat sink and an air mover. The heat sink may be placed in thermal contact with a heat generating component of the computing device. The shroud includes two or more openings to route air. The air mover may be selectively mounted to move air through the first opening or the second opening. The different mounting options enable the user to accommodate different internal arrangements of computing device enclosures with a common heat sink and air mover configuration. Additional details will now be described.

Figure 1:
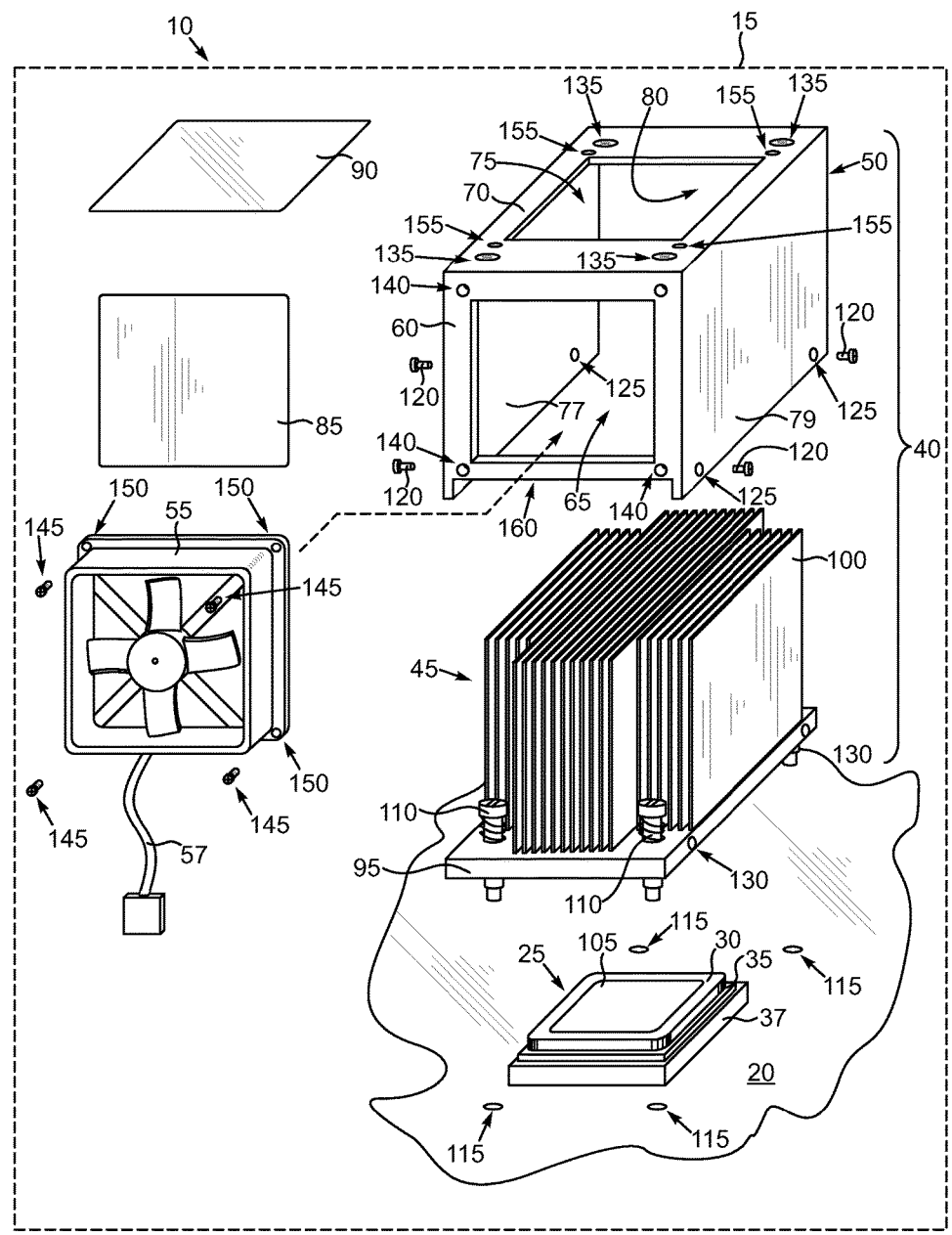
FIG. 1 is an exploded pictorial view of an exemplary embodiment of a cooling system for a computing device.

In the drawings described below, reference numerals are generally repeated where identical elements appear in more than one figure. Turning now to the drawings, and in particular to FIG. 1, therein is depicted a schematic view of an exemplary embodiment of a computing device 10 that includes some form of enclosure 15 depicted as a dashed box. The computing device 10 may include a system board 20, which may be a printed circuit board or other type of system board. The computing device 10 may be any of a large variety of different types of computing devices such as an integrated circuit dedicated to video processing, a central processing unit (CPU), a graphics processing unit (GPU), an accelerated processing unit (APU) that combines microprocessor and graphics processor functions, an application specific integrated circuit, an active optical circuit, a memory device or other device that may benefit from thermal management. The enclosure 15 may similarly be constructed in a great variety of shapes and sizes. Examples include full ATX, mid ATX, micro ATX, mini ITX, media center cases, server cases or other types of enclosures. Plastics, stainless steel, aluminum, carbon steel combinations of these or others may be used.

The system board 20 may include one or more heat generating components, one of which is shown and labeled 25. The heat generating component 25 may be an integrated circuit device, a circuit card, a power supply or one of many other types of components that may benefit from thermal management. In this illustrative embodiment, the heat generating component 25 may be a packaged semiconductor chip that includes a package substrate 30 and optional lid 35, which serves as a heat spreader. The heat generating component 25 may be mounted in a socket 37, which may be a pin grid array, land grid array or virtually any other type of mounting device for integrated circuits.

Thermal management for the heat generating component 25 may be provided by a cooling system 40, which is depicted exploded from the system board 20. The cooling system 40 may include a heat sink 45 that is designed to mount on and establish thermal contact with the heat generating component 25, a shroud or duct 50 that is designed to channel air flow around the heat sink 45 and an air mover 55, which may be an axial flow fan as depicted or other types air movers as described in more detail below. The term "air" as used herein is intended to encompass air and/or other gases. The air mover 55 may be provided with power from the system board 20 or otherwise by way of a connector cable 57 of virtually type. For simplicity of illustration, the connector cable 57 will not be shown in subsequent figures. The shroud 50 may be constructed of a variety of materials, such as, for example, plastics, stainless steel, copper, aluminum, combinations of these or other materials useful for thermal management devices or others. Various fabrication techniques may be used to fabricate the shroud 50, such as molding, stamping, punching, casting or others. Integral configurations may be advantageously constructed by molding or casting. If constructed of ductile materials, then stamping, punching, etc., can be used to create a blank that may be later plastically deformed by folding various walls to create the desired shape. Drilling, stamping or other techniques may be used to form the various holes and openings if not created during a molding process. The shroud 50 advantageously has a modular construction so that for a given shroud design, the air mover 55 may be mounted in more than one orientation to account for physical dimensions and other internal components of the enclosure 15 of the computing device 10. For example, the shroud 50 may include a front wall 60 that has an opening 65 and a top wall 70 which has an opening 75. The front wall 60 and the top wall 70 may be connected to opposing side walls 77 and 79. In this way, the air mover 55 may be mounted on the front wall 60 and channel air flow through the opening 65, across the heat sink 45 and either entering or exiting by way of the back opening 80 of the shroud 50. Optionally, the air mover 55 may be mounted on the top wall 70 and air flow provided by way of the opening 75 and the back opening 80. The front opening 65 may be initially closed by way of a removable cover 85 which is shown exploded from the shroud 50. The top opening 75 may be similarly initially sealed by way of a removable cover 90. The covers 85 and 90 may be constructed of the same types of materials as the shroud 50 or other materials, and be secured to the front wall 60 and top wall 70, respectively, in a variety of ways such as by adhesives, fasteners or other techniques. In an exemplary embodiment, the covers 85 and 90 may consist of removable or peelable labels composed of polycarbonate or other polymeric materials. Of course, either or both of the side walls 77 and 79 could be fitted with openings and covers (not shown) if desired to provide even more mounting flexibility. The shroud 50 may be fabricated as an integral structure or from separate components that may be subsequently joined together by well-known fastening techniques.

The heat sink 45 may be fabricated in a large variety of different configurations. In this illustrative embodiment, the heat sink 45 may include a base member 95 and plural heat fins 100 that may be attached to or formed integral with the base member 95. The number and arrangement of the heat fins 100 may take on a very large variety of different shapes, sizes and configurations. Here, generally rectangular forms are used for the fins 100, however the fins 100 may be arranged in circular or virtually any other shape. The base member 95 and the fins 100 may be constructed of well-known heat sink materials, such as, copper, aluminum, stainless steel, brass, or others. The base member 95 is designed to establish thermal contact with the lid 35 of the heat generating member 25. This may be facilitated by applying a thermal interface material 105 to the lid 35. The thermal interface material 105 may be a thermal grease, or even a solder, such as indium or other type of thermal interface material. The base member 95 may be secured to the system board 20 in a variety of ways using screws, bolts, clips or other types of fasteners. In this illustrative embodiment, the base 95 may be attached to the system board 20 by way of spring loaded screw driven pins 110. Two of the screws 110 are depicted, however the skilled artisan will appreciate that there can be two additional screws that are obscured by the heat fins 100. The screws 110 may seat in respective anchor holes 115 in the system board 20. Again, the anchoring mechanism by which the pins 110 adhere to the board 20 may be by way of threads, rivets or other types of fastening techniques.

The shroud 50 may be secured to the heat sink 45 using a variety of fastening techniques, such as, screws, rivets, clips or other types of fastening devices. In this illustrative embodiment, the shroud 50 may be secured to the heat sink 45 by way of screws 120 which insert into respective holes 125 of the shroud 50 and ultimately into corresponding holes 130 in the base member 95. Note that one of the holes 125 of the shroud 50 is obscured by the front cover 60 and the two left side holes 130 of the base member 95 are not visible in FIG. 1. The shroud 50 may include tool access holes 135 in the top cover 70. These tool access holes 135 provide easy access for a screw driver or other tool to access the mounting pins 110 when the shroud 50 is positioned on the heat sink 45. The front wall 60 may include mounting holes 140 which are designed to facilitate the attachment of the air mover to the front wall 60 by way of respective screws 145. The screws 145 may initially insert into respective screw holes 150 in the air mover 55.

The top wall 70 may similarly include screw holes 155 which are designed to receive the screws 145 in the event that the air mover 55 is mounted on the top wall 70 as opposed to the front wall 60. The shroud 50 may be constructed with a notch 160 at the lower end of the front wall 60 so that the lower end of the front wall 60 at the notch 160 may seat on the upper surface of the base member 95. Optionally, the notch 160 may be eliminated and the shroud 50 lengthened such that the inside of the front wall 60 is forward of the front edge of the base member 95.

Figure 2:
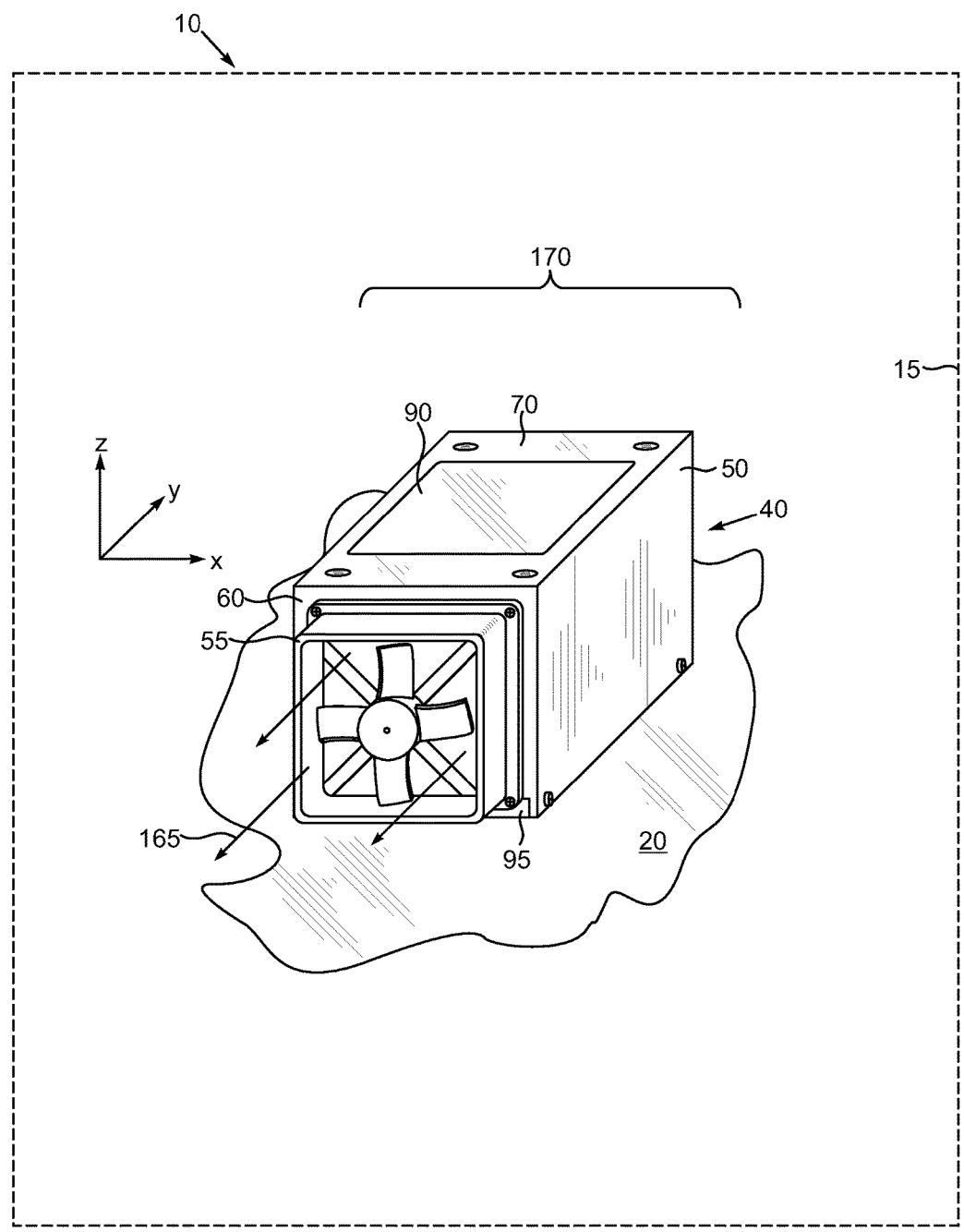
FIG. 2 is a pictorial view of the exemplary cooling system of FIG. 1 depicted unexploded.
Figure 3:
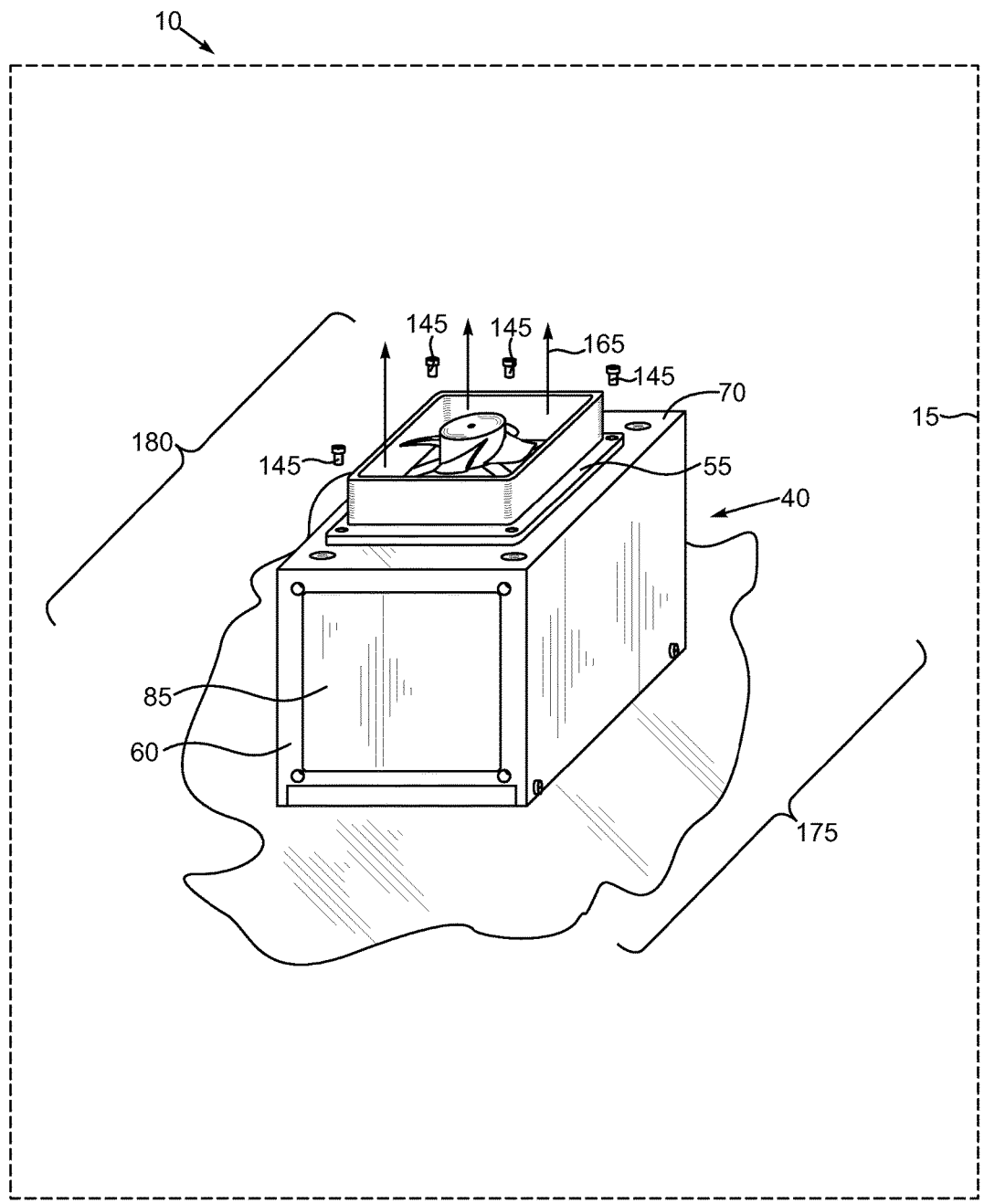
FIG. 3 is a pictorial view like FIG. 2, but depicting an alternate exemplary air mover placement for the cooling system.

FIG. 2 depicts the cooling device 40 assembled and seated on the system board 20. An x, y and z coordinate system is depicted in this figure and subsequent figures to facilitate the description of air flow and the movement of various components. However, references to directions and movements relative to the x, y and z-axes are used herein for ease of description only. Here, the removable cover 90 is in place on the top wall 70 of the shroud 50 while the air mover 55 is secured to the front wall 60 and thus the removable cover 85 depicted in FIG. 1 is removed. A small portion of the base member 95 is just visible in FIG. 2. In this configuration, the air mover 55 is mounted to the front wall 60 and provides a flow of cooling air 165 in the direction of the y-axis. The region of the enclosure 15 above the shroud 50 of the cooling system 40 and over the portion of the system board 20 where the cooling system 40 is position may consist of a keep-out 170. The presence of the keep-out 170 may be due to the presence of other devices or structures in, or the very size and shape of the enclosure 15. In this circumstance, mounting the air mover 55 on the front wall 60 may make more technical sense than a top-mounted scheme. However, and as depicted in FIG. 3, the enclosure 15 of the computing device 10 may, instead of including an overhead keep-out 170 as depicted in FIG. 2, include a lateral keep-out 175 and perhaps another lateral keep-out 180 to either side of the cooling system 40. In this circumstance, it may be technically advantageous to mount the air mover 55 on the top wall 70 while leaving the front removable cover 85 in place on the front wall 60. In this way, the cooling air 165 is moved in a direction generally parallel to the z-axis as opposed to the y-axis in the arrangement depicted in FIG. 2. Note that the screws 145 are shown exploded in FIG. 3. Of course it may also be possible to remove the cover 85 even when the air mover 55 is mounted on the top wall 70 and vice versa if it is anticipated that inlet/discharge air might advantageously be moved through the opening 65 (not visible) beneath the cover 85.

Figure 4:
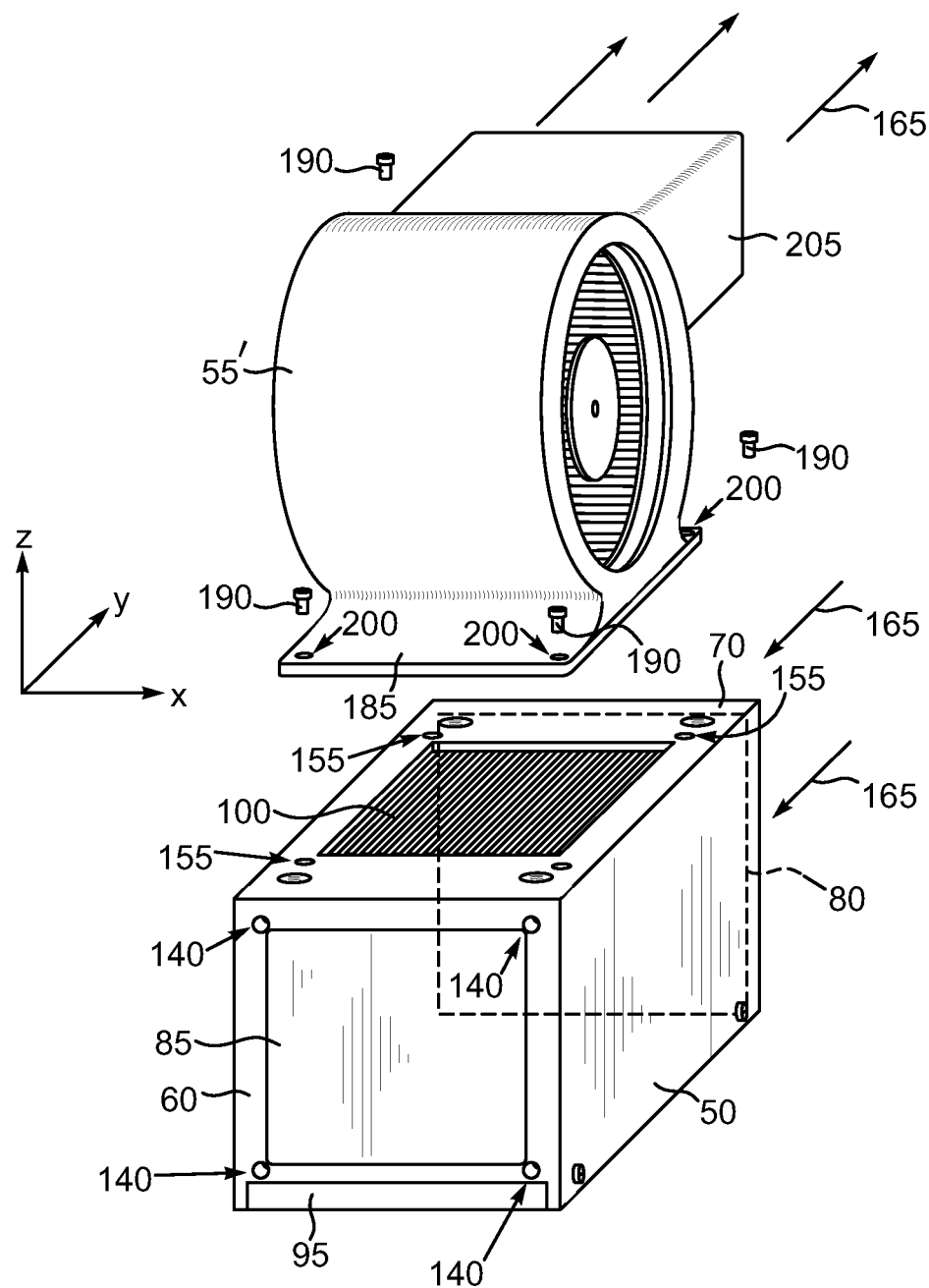
FIG. 4 is a pictorial view of an alternative exemplary air mover and cooling system shroud.

The skilled artisan will appreciate that a great variety of different types of air movers may be used other than the axial fan air mover 55 depicted in FIGS. 1, 2 and 3. For example, and as depicted in FIG. 4, an air mover 55' may be in the form of a blower, which is shown exploded from the shroud 50 but which is designed to mount on either the top wall 70 or the front wall 60 of the shroud 50 using the techniques described elsewhere herein. For example, the blower 55' may include a base 185 that is designed to seat on the front wall 60 or the top wall 70 and be secured thereto by way of suitable screws 190 which insert through screw holes 200 in the base 185 and ultimately into the screw holes 155 in the top wall 70 or the screw holes 140 in the front wall 60. Again, note that a small portion of the base member 95 is visible in FIG. 4 when the shroud 50 is in place. The blower 55' may include an inlet or outlet duct 205 to move cooling air 165 past the heat fins 100, which are visible through the opening 75 of the top wall 70. Cooling air 165 will inlet or outlet by way of the back opening 80, and/or the front opening (not visible) if the removable cover 85 is lifted.

Figure 5:
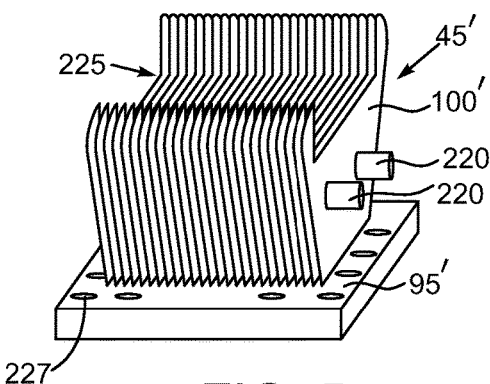
FIG. 5 is a pictorial view of an alternative exemplary embodiment of a heat sink.

As noted above, a heat sink usable with a modular shroud and optional air mover may take on a large number of configurations. FIG. 5 is a pictorial view of an alternate exemplary embodiment of a heat sink 45' that may be used with a modular shroud (not shown). The heat sink 45' may include a base member 95' and plural heat fins 100'. One or more heat pipes 220 may be nested within or otherwise placed in thermal contact with the heat fins 100'. Indeed, any of the disclosed heat sink embodiments may include one or more heat pipes 220. Here, the heat fins 100' are constructed with a top notch 225 simply to provide greater surface area for air flow. The base 95' may include plural mounting holes for fasteners (not shown). The materials disclosed above may be used to construct the heat sink 45'.

Figure 6:
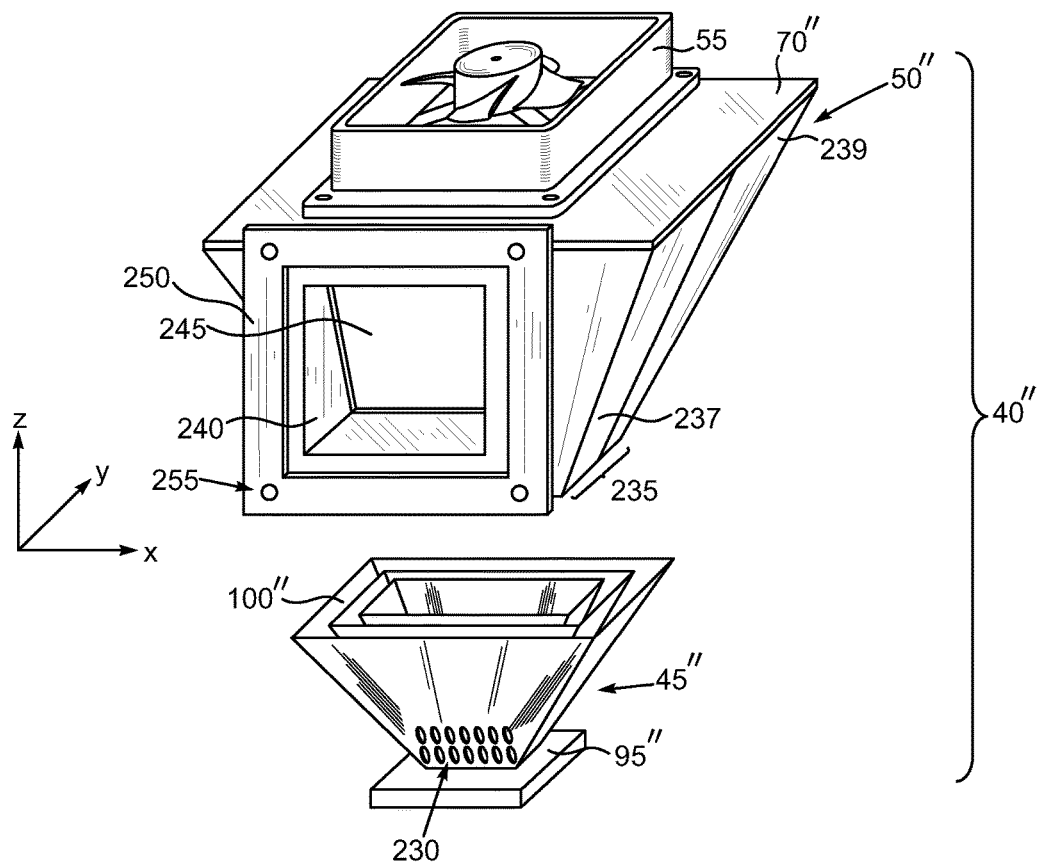
FIG. 6 is a partially exploded pictorial view of an alternate exemplary cooling system for a computing device.

Another exemplary cooling system 40" is depicted pictorially in FIG. 6. Here, a heat sink 45" may take on yet another possible configuration of the myriad of different types of designs that a heat sink may use. In this illustrative embodiment, the heat sink 45" includes plural nested generally conical/rectangular fins or fin shells 100" mounted on a base 95". One or more of the fin shells 100" may be provided with plural air holes 230 to facilitate air movement. Virtually any shaped shroud might be used with the alternative heat sink 45". Here, however, a generally rectangular/conical shroud 50" may be used to somewhat match the overall external footprint of the heat sink 45". In this regard, the shroud 50" may include a conical/rectangular shell 235 that may consist of a front half 237 that is joined in using any of a number of well-known techniques to a back half 237. In order to accommodate the larger footprint of the upper end of the fins 100" the shell halves 237 and 239 may be initially separated along the y-axis then brought down near the base 95" and moved together along the y-axis and ultimately joined. Thereafter, a suitable top wall 70" may be secured to the shell 235. In order to accommodate multiple air flow configurations, the air mover 55 may be top mounted to the top wall 70" as depicted or alternatively to some portion of the shell 235. In this regard, and in this illustrative embodiment, the shell half 237 may be provided with a suitable duct 240 that leads to an opening 245 in the front shell half 237. The duct 240 may include a front facing flange 250 that is designed to receive the air mover 55. The air mover 55 may be secured to the flange 250 by way of the screw holes 255 and screws which are not depicted. Again, this is merely to illustrate that many different types of heat sink shapes and configurations may be provided with suitable shrouds and air movers in order to accommodate large numbers of different types of interior spaces and keep-outs in different computing devices.

The modular nature of the disclosed cooling systems provide the user with flexibility in the accommodation of the internal structure of a computing device enclosure not only at the initial installation phase but also during subsequent modifications and upgrades. For example, and as depicted in FIG. 2, the cooling system 40 may be installed in the enclosure 15 with the air mover 55 in the orientation depicted when there are, at that time, no keep-outs to either side of the shroud 50. However, subsequently additional components may be inserted into the enclosure 15 as shown in FIG. 3 that create lateral keep-outs 175 and 180. In order to accommodate the lateral keep-outs 175 and 180 in the modified enclosure 15 shown in FIG. 3, the air mover 55 may be moved to the alternative position as shown. Other circumstances may involve the initial placement of the cooling system 40 in an enclosure 15 of one sort or another and thereafter the removal of the cooling system 40 and placement in another enclosure that has a different internal configuration. This may a different computing device or just a different enclosure for the same computing device. In that circumstance, it may be appropriate to tailor the positioning of the air mover relative to the shroud in order to accommodate the internal workings of the new enclosure in which the cooling system is positioned. These represent just two examples of the advantages of using the disclosed modular embodiments.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A thermal management system, comprising:
a heat sink operable to convey heat from a heat generating component;
a duct configured to be positioned in a computing device enclosure and having a first side and a second side, the first side having a first air mover mounting position, a first opening in the first side proximate the first air mover mounting position to direct air in a first direction past the heat sink, the second side having a second air mover mounting position and a second opening proximate the second air mover mounting position to direct air in a second direction past the heat sink, the second direction being non-parallel to the first direction; and
a removable cover to block the first opening and enable air to be moved through the second opening or to block the second opening to enable air to be moved through the first opening.

2. The thermal management system of claim 1, comprising an air mover coupled to the duct at the first air mover mounting position to move air through the first opening or at the second air mover mounting position to move air through the second opening.

3. The thermal management system of claim 1, comprising a first removable cover to block the first opening and a second removable cover to block the second opening.

4. The thermal management system of claim 1, wherein the heat sink includes a base member to thermally contact the heat generating component, the duct being coupled to the base member.

5. The thermal management system of claim 2, wherein the air mover comprises a fan or a blower.

6. The thermal management system of claim 1, wherein the duct comprises an integral structure.

7. The thermal management system of claim 1, wherein the duct comprises multiple components.

8. A computing device, comprising:
an enclosure;
a heat generating component in the enclosure;
a heat sink in the enclosure operable to convey heat from a heat generating component;
a duct in the enclosure and having a first side and a second side, the first side having a first air mover mounting position, a first opening in the first side proximate the first air mover mounting position to direct air in a first direction past the heat sink, the second side having a second air mover mounting position and a second opening proximate the second air mover mounting position to direct air in a second direction past the heat sink, the second direction being non-parallel to the first direction; and
a removable cover to block the first opening and enable air to be moved through the second opening or to block the second opening to enable air to be moved through the first opening.

9. The computing device of claim 8, comprising an air mover coupled to the duct at the first air mover mounting position to move air through the first opening or at the second air mover mounting position to move air through the second opening.

10. The computing device of claim 8, comprising a first removable cover to block the first opening and a second removable cover to block the second opening.

11. The computing device of claim 8, wherein the heat sink includes a base member to thermally contact the heat generating component, the duct being coupled to the base member.

12. The computing device of claim 9, wherein the air mover comprises a fan or a blower.

13. The computing device of claim 8, wherein the duct comprises an integral structure.

14. The computing device of claim 8, wherein the duct comprises multiple components.

15. A method of providing thermal management for a heat generating component, comprising:
placing a heat sink in thermal contact with the heat generating component;
coupling a duct to the heat sink, the duct having a first side and a second side, the first side having a first air mover mounting position, a first opening in the first side proximate the first air mover mounting position to direct air in a first direction past the heat sink, the second side having a second air mover mounting position and a second opening proximate the second air mover mounting position to direct air in a second direction past the heat sink, the second direction being non-parallel to the first direction, the duct also including a first removable cover over the first opening and a second removable cover over the second opening; and
removing the first removable cover and moving air through the first opening or removing the second removable cover and moving air through the second opening.

16. The method of claim 15, comprising coupling an air mover to the duct at the first air mover mounting position to move air through the first opening or at the second air mover mounting position to move air through the second opening.

17. The method of claim 16, wherein the air mover comprises a fan or a blower.

18. The method of claim 15, wherein the heat generating component is positioned in a first enclosure and the first removable cover is removed and air is moved through the first opening and thereafter the second removable cover is removed and air is moved through the second opening.

19. The method of claim 18, wherein the heat generating component is positioned in a second enclosure after the first enclosure and the second removable cover is removed and air moved through the second opening.

* * * * *